United States Patent
Ye et al.

(10) Patent No.: US 7,694,267 B1
(45) Date of Patent: Apr. 6, 2010

(54) METHOD FOR PROCESS WINDOW OPTIMIZED OPTICAL PROXIMITY CORRECTION

(75) Inventors: Jun Ye, Palo Alto, CA (US); Jiangwei Li, Palo Alto, CA (US); Stefan Hunsche, Sunnyvale, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 502 days.

(21) Appl. No.: 11/670,848

(22) Filed: Feb. 2, 2007

Related U.S. Application Data

(60) Provisional application No. 60/764,655, filed on Feb. 3, 2006.

(51) Int. Cl.
G06F 17/50 (2006.01)
(52) U.S. Cl. .......................................................... 716/19
(58) Field of Classification Search ............... 716/19–21
See application file for complete search history.

(56) References Cited

U.S. PATENT DOCUMENTS

| | | | |
|---|---|---|---|
| 6,753,115 B2 * | 6/2004 | Zhang et al. .................... 430/5 |
| 7,114,145 B2 | 9/2006 | Ye et al. | |
| 2003/0229880 A1 * | 12/2003 | White et al. ................... 716/19 |
| 2004/0181770 A1 * | 9/2004 | Zhang ........................ 716/19 |
| 2006/0136862 A1 * | 6/2006 | Nojima et al. ................ 716/21 |
| 2006/0236271 A1 * | 10/2006 | Zach ............................. 716/1 |
| 2007/0031745 A1 | 2/2007 | Ye et al. | |
| 2007/0061773 A1 * | 3/2007 | Ye et al. ........................ 716/21 |
| 2007/0113216 A1 * | 5/2007 | Zhang .......................... 716/17 |
| 2008/0204690 A1 * | 8/2008 | Berger et al. .................. 355/67 |

OTHER PUBLICATIONS

S.P. Renwick, "What Makes a Coherence Curve Change?" Proc. SPIE vol. 5754, pp. 1537-1547 (2005).
Y. Cao et al., "Optimized Hardware and Software for Fast, Full Chip Simulation," Proc. SPIE vol. 5754, pp. 407-414 (2005).
C. Spence, "Full-Ship Lithography Simulation and Design Analysis—How OPC is Changing IC Design," Proc. SPIE vol. 5751, pp. 1-14 (2005).
S.H. Choi et al. "Illumination and Multi-Step OPC Optimization to Enhance Process Margin of the 65 nm Node Device Exposed by Dipole Illumination," Proc. SPIE vol. 5754, pp. 838-845 (2005).

(Continued)

*Primary Examiner*—Stacy A Whitmore
(74) *Attorney, Agent, or Firm*—Pillsbury Winthrop Shaw Pittman LLP

(57) ABSTRACT

One embodiment of a method for process window optimized optical proximity correction includes applying optical proximity corrections to a design layout, simulating a lithography process using the post-OPC layout and models of the lithography process at a plurality of process conditions to produce a plurality of simulated resist images. A weighted average error in the critical dimension or other contour metric for each edge segment of each feature in the design layout is determined, wherein the weighted average error is an offset between the contour metric at each process condition and the contour metric at nominal condition averaged over the plurality of process conditions. A retarget value for the contour metric for each edge segment is determined using the weighted average error and applied to the design layout prior to applying further optical proximity corrections.

16 Claims, 12 Drawing Sheets

OTHER PUBLICATIONS

K. Lucas et al. "Process, Design and OPC Requirements for the 65 nm Device Generation," Proc SPIE vol. 5040, pp. 408-419 (2003).

J. Bruce et al. "Model-Based Verification for First Time Right Manufacturing," Proc. SPIE vol. 5756, pp. 198-207 (2005).

J.A. Torres et al. "Study Towards Model-Based DRC Verification," Proc. SPIE, vol. 5992, pp. 599223L-1-599223L-8 (2005).

S. Andrews et al. "Polysilicon Gate and Polysilicon Wire CD/EPE Defect Detection and Classification Through Process Window," Proc. SPIE vol. 6349, pp. 634932-1-634932-7 (2006).

D. Zhang et al. "Model-Based Lithography Verification Using the New Manufacturing Sensitivity Model," Proc. SPIE vol. 6349, pp. 63494Q-1-63494Q-8 (2006).

* cited by examiner

METHOD FOR PROCESS WINDOW OPTIMIZED OPTICAL PROXIMITY CORRECTION

CROSS-REFERENCE TO RELATED APPLICATION

This application claims the benefit of U.S. Provisional Application No. 60/764,655, entitled "System and Methods for Process-Window Optimized Optical Proximity Correction, and Device," filed Feb. 3, 2006. The subject matter of the related application is hereby incorporated by reference.

FIELD OF THE INVENTION

This invention relates generally to optical proximity correction for photolithography and relates more particularly to a system and method for process window optimized optical proximity correction.

BACKGROUND

In the semiconductor industry, microlithography (or simply lithography) is the process of printing circuit patterns on a semiconductor wafer (for example, a silicon or GaAs wafer). Currently, optical lithography is the predominant technology used in volume manufacturing of semiconductor devices and other devices such as flat-panel displays. Such lithography employs light in the visible to deep ultraviolet spectrum range to expose photo-sensitive resist on a substrate. In the future, extreme ultraviolet (EUV) and soft x-rays may be employed. Following exposure, the resist is developed to yield a relief image.

In optical lithography, a photomask (often called a mask or a reticle) that serves as a template for the device structures to be manufactured is first written using electron-beam or laser-beam direct-write tools. A typical photomask for optical lithography consists of a glass (or quartz) plate of six to eight inches on a side, with one surface coated with a thin metal layer (for example, chrome) of a thickness of about 100 nm. The device pattern is etched into the metal layer, hence allowing light to transmit through the clear areas. The areas where the metal layer is not etched away block light transmission. In this way, a pattern may be projected onto a semiconductor wafer.

The mask contains certain patterns and features that are used to create desired circuit patterns on a wafer. The tool used in projecting the mask image onto the wafer is called a "stepper" or "scanner" (hereinafter collectively called "exposure tool"). FIG. 1 is a diagram of an optical projection lithographic system 10 of a conventional exposure tool. System 10 includes an illumination source 12, an illumination pupil filter 14, a lens subsystem 16a-c, a mask 18, a projection pupil filter 20, and a wafer 22 on which the aerial image of mask 18 is projected. Illumination source 12 may be laser source operated, for example, at UV (ultra-violet) or DUV (deep ultra-violet) wavelengths. The light beam of illumination source 12 is expanded and scrambled before it is incident on illumination pupil 14. Illumination pupil 14 may be a simple round aperture, or may have specifically designed shapes for off-axis illumination. Off-axis illumination may include, for example, annular illumination (i.e., illumination pupil 14 is a ring with a designed inner and outer radius), quadruple illumination (i.e., illumination pupil 14 has four openings in the four quadrants of the pupil plane), and other shapes like dipole illumination.

After illumination pupil 14, the light passes through the illumination optics (for example, lens subsystem 16a) and is incident on mask 18, which contains the circuit pattern to be imaged on wafer 22 by the projection optics. As the desired pattern size on wafer 22 becomes smaller and smaller, and the features of the pattern become closer and closer to each other, the lithography process becomes more challenging. The projection optics (for example, lens subsystems 16b and 16c, and projection pupil filter 20) images mask 18 onto wafer 22. Pupil 20 of the projection optics limits the maximum spatial frequency of the mask pattern that can be passed through the projection optics system. A number called "numerical aperture" or NA often characterizes pupil 20.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

In most exposure tools, the optical system reduces the size of the pattern from the mask level to the wafer level by a reduction factor, typically 4× or 5×. Because of this the pattern at the mask level is typically larger than the desired pattern at the wafer level, which reduces the dimensional control tolerances required at the wafer level and improves the yield and manufacturability of the mask-making process. This reduction factor of the exposure tool introduces a certain confusion in referring to "the dimension" of the exposure process. Herein, features sizes and dimensions refer to wafer-level feature sizes and dimensions, and the "minimum feature size" refers to a minimum feature at the wafer level.

For an exposure process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the CDs of all critical features are within these predefined tolerances. For the exposure process to be viable in a manufacturing environment, the full CD distribution must fall within the tolerance limits across a range of process conditions that represents the typical range of process variation expected to occur in the fab.

The range of process conditions over which the CD distribution will meet the specification limits is referred to as the "process window." While many variables must be considered to define the full process window, in lithography processes it is typical to describe only the two most critical process parameters, focus and exposure offsets, in defining the process window. A process may be considered to have a manufacturable process window if the CDs fall within the tolerance limits, e.g., +/−10% of the nominal feature dimension, over a range of focus and exposure conditions which are expected to be maintainable in production. FIG. 2A is a diagram of a process window 30 as an area in exposure-focus (E-F) space in which CDs are within tolerance limits for up to +/−100 nm of focus error and +/−10% exposure error. It should be noted that while this may seem to be an unusually large range of exposure variation, given that state of the art exposure tools can easily control the energy delivered at the wafer plane to less than 1% variation, the exposure dose tolerance must be significantly larger than the expected variation in energy since exposure latitude also serves as a surrogate for a wide range of other process variations such as film thickness, reflectivity, resist processing, develop processing, exposure tool aberrations, and others. It should also be noted that different pattern types or sizes usually have different process windows, and that the manufacturability of a device design depends on the common process window of all features in the mask. As shown in FIG. 2B, the common process window 210 is normally smaller than the process window for each individual feature.

Factors that limit or degrade the fidelity of the pattern transfer process include imperfections in the mask-making process, in the projection optics, in the resist process, and in the control of the interaction between the projected light and the film stacks formed on the wafer. See John G. Skinner et al., Photomask Fabrication and Procedures and Limitations, Handbook of Microlithography, Micromachining, and Microfabrication, Vol. 1: Microlithography, Ch. 5, P. Rai-Choudhury, editor, SPIE Press, pp. 464-466 (1997). However, even with a perfect mask, perfect optics, a perfect resist system, and perfect substrate reflectivity control, image fidelity becomes difficult to maintain as the dimensions of the features being imaged become smaller than the wavelength of light used in the exposure tool. For exposure processes using 193 nm illumination sources, features as small as 65 nm are desired. In this deep sub-wavelength regime, the pattern transfer process becomes highly non-linear, and the dimensions of the final pattern at the wafer level become a very sensitive function not only of the size of the pattern at the mask level, but also of the local environment of the feature, where the local environment extends out to a radius of roughly five to ten times the wavelength of light. Given the very small feature sizes compared to the wavelength, even identical structures on the mask will have different wafer-level dimensions depending on the sizes and proximities of neighboring features, and even features that are not immediately adjacent but still within the proximity region defined by the optics of the exposure tool. These optical proximity effects are well known in the literature. See, for example, Alfred K. Wong, Resolution Enhancement Techniques in Optical Lithography, SPIE Press, pp. 91-101 (2001); S. P. Renwick, "What makes a coherence curve change?," Optical Microlithography XVIII, Bruce W. Smith, Editor, Proceedings of SPIE, Vol. 5754, pp. 1537-1547 (2005).

In an effort to improve imaging quality and minimize high non-linearity in the pattern transfer process, current processing techniques employ various resolution enhancement technologies ("RET"). One of the leading types of RETs in use today is optical proximity correction (OPC), a general term for any technology aimed at overcoming proximity effects. One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at nominal process condition. Even though such bias could, in principle, be applied to give uniform CD vs. pitch curves at best focus and exposure, once the exposure process varies from the nominal condition each biased pitch curve will respond differently, resulting in different process windows for the different features. Therefore, the "best" bias to give identical CD vs. pitch may even have a negative impact on the common process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of CD shortening of a long line can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches have been developed to help solve the line end pull back problem. Extra structures (or assist features) known as "hammerheads" or "serifs" are routinely added to line ends to effectively anchor them in place and provide reduced pull back over the entire process window. Even at best focus and exposure these extra structures are not clearly resolved and they alter the appearance of the main feature without being fully resolved on their own. Assist features can take on much more aggressive forms than simple hammerheads added to line ends, to the extent the pattern on the mask is no longer simply the desired wafer pattern upsized by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithography process to produce the pattern intended by the designer on the wafer as closely as possible.

In another OPC technique, instead of appending assist structures such as serifs to a feature, completely independent and non-resolvable assist features are added to the mask. These independent assist features are not intended or desired to print as features on the wafer, but rather are intended to modify the aerial image of a nearby main feature to enhance the printability and process tolerance of that main feature. Often referred to as "scattering bars," this type of sub-resolution assist feature (SRAF) adds yet another layer of complexity to a mask. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Many of these OPC techniques must be used together on a single mask with phase-shifting structures of different phases added in as well for both resolution and process window enhancement. The simple task of biasing a one-dimensional line becomes increasingly complicated as two-dimensional structures must be moved, resized, enhanced with assist features, and possibly phase-shifted without causing any conflict with adjoining features. Due to the extended proximity range of deep sub-wavelength lithography, changes in the type of OPC applied to a feature can have unintended consequences for another feature located within half a micron to a micron. Since there are likely to be many features within this proximity range, the task of optimizing OPC decoration becomes increasingly complex with the addition of more aggressive approaches. Each new feature that is added to a design has an effect on other features, which then must be re-corrected in turn, and the results must be iterated repeatedly to converge to a mask layout where each feature can be printed in the manner in which it was originally intended while at the same time contributing in the proper manner to the aerial images of its neighboring features such that they too are printed within their respective tolerances.

Due to this complexity and mutual interaction between features, OPC technology has become a major field of innovation and many techniques have been widely described on how to "segment" or "dissect" the features into a manageable number of edges for co-optimization, how to prioritize the optimization routines so that the most critical structures are best protected from unintended distortion by nearby OPC assist features on neighboring features, how to resolve phase and placement conflicts between features, how to trade off computational speed versus ultimate convergence of the resulting feature to the desired results, and other details of the full implementation of OPC as a manufacturable technology.

Because of the enormous complexity of co-optimizing the simultaneous patterning of many different features over a wide range of proximities, most of the techniques described above have been directed to the measurable metric of minimizing the error between the design pattern and the printed pattern at best focus and exposure. The best OPC application is usually considered to be that which minimizes the residual error between the design and a simulated pattern printed at the optimal focus and exposure conditions, without considering how the effects of those OPC decorations will vary across the process window. A great deal of effort is made in the research and development phase to study the patterning of different features, including different "flavors" or "styles" of OPC, across the process window, but it is not possible to test all possible combinations of geometries during this development cycle. Once an OPC style has been developed and adopted, it must be applied in short order to any combination of features that is delivered by designers within the constraints of the design rules mutually agreed upon between the process engineers who will manufacture the chip and the designers. Whether the OPC-decorated layout that is produced for these new combinations of features will perform well over the full range of process conditions, especially focus and exposure variations, is not considered as part of the computation that takes places in apply the OPC to the design.

Current approaches to OPC have not entirely ignored the question of process window tolerance, but typically the performance of an OPC-decorated pattern as a function of focus and exposure is only tested after the OPC decorations have been finalized. One approach for performing full chip lithography simulation across the process window to detect features with non-acceptable printing errors is described in U.S. Pat. No. 7,114,145, entitled "System and Method for Lithography Simulation," the subject matter of which is hereby incorporated by reference in its entirety. Other approaches to post-OPC inspection of a mask have also been developed. See James A Bruce et al., "Model-Based Mask Verification for First Time Right Manufacturing," Design and Process Integration for Microelectronic Manufacturing III, Lars W. Liebmann, editor, Proc. SPIE, Vol. 5756, pp. 198-207 (2005); J. Andres Tones and Nick Cobb, "Study towards model-based DRC verification," 25th Annual BACUS Symposium on Photomask Technology, edited by J. Tracy Weed, Proc. SPIE, Vol. 5992 (2005); Scott Andrews et al., "Polysilicon gate and polysilicon wire CD/EPE defect detection and classification through process window," Photomask Technology 2006, Patrick M. Martin and Robert J. Naber; Eds., Proc. SPIE, Vol. 6349 (2006); and Denial Zhang et al., "Model-based lithography verification using the new manufacturing sensitivity model," Photomask Technology 2006, Patrick M. Martin and Robert J. Naber; Eds., Proc. SPIE, Vol. 6349 (2006). All of these techniques act as inspections, taking an OPC-decorated layout as input and running selected simulations of the lithography process using the layout and then detecting potential errors in the printed pattern. The calculations involved in such inspections are much simpler than those used in the OPC decoration process since they only require a pass/fail answer based on a fixed layout, not an adaptive movement of all of the critical edges in a design to find a co-optimized solution to a complex multi-parameter problem.

As process windows shrink and feature sizes become an ever smaller fraction of the exposure wavelength, the approach of applying OPC decorations at one set of exposure conditions and then inspecting the decorated design for defects across the process window will begin to break down. Several approaches have been described to begin to address this problem. The ultimate solution would be to compute the full process window performance of each edge segment of a design during the optimization routine itself, but the computational requirements of such a task exceed even the capabilities of the simulation system of U.S. Pat. No. 7,114,145. Each edge segment may be moved many times during the repeated iterations of the OPC optimization process and to recompute the simulated patterning of each segment across the full process window for each step of each iteration would be intractable using current computing tools. Different approximation techniques have been attempted to reduce the problem to manageable proportions.

OPC has generally moved from a rule-based to a model-based approach. In model-based OPC, both the effect of the exposure tool on the aerial image and the effect of the resist processing are modeled mathematically. FIG. 3 is a flowchart showing a typical model-based OPC design process. In step 310, a pre-OPC layout, an OPC technology file, an optical model, and a resist model are obtained. The OPC technology file describes the types of model-based OPC techniques that are to be used, for example linewidth bias corrections, corner rounding corrections, or line end pull back corrections. The optical model describes the illumination and projection optics of the exposure tool. The optical model may also include the effect of imaging into a thin-film resist or the effect of the mask topography. The resist model describes the changes in the resist after being illuminated by the mask pattern in the exposure tool. An etch model may also be used in the method of FIG. 3. The optical, resist, and etch models can be derived from first principles, determined empirically from experimental data, or a combination of both. The models are usually calibrated at the nominal process condition. See R. Socha, "Resolution Enhancement Techniques," Photomask Fabrication Technology, Benjamin G. Eynon, Jr. and Banqiu Wu, Editors, McGraw-Hill, pp. 466-468, 2005. The pre-OPC layout, the OPC technology file, and the models are all inputs to the model-based OPC software.

In step 312, the model-based OPC software dissects the features in the pre-OPC layout into edge segments and assigns control points to each edge segment. Each feature is dissected prior to applying any OPC techniques because each feature, even identically-shaped features, will be subject to different proximity environments. The control points (or evaluation points) are the locations where CD or edge placement errors (EPE) will be evaluated during the OPC design process. The assignment of the control points is a complex process that depends on the pattern geometry of the pre-OPC layout and the optical model. FIG. 4 shows an L-shaped feature 410 with dissection points represented by triangles and assigned control points represented by circles.

In step 314, the model-based OPC software simulates the printed resist image on the wafer by applying the optical model and the resist model to the pre-OPC layout. In general, the simulation is performed at the nominal process condition at which the optical model has been calibrated. In step 316, the model-based OPC software generates the contours of the simulated resist image by comparing the simulated resist image values to a predetermined threshold value. The model-based OPC software then compares the simulated contours with the pre-OPC layout at all of the control points to determine if the design layout will deliver the desired patterning performance. The comparisons are typically quantified as a CD or an EPE at each control point. In step 318, the model-based OPC software determines whether a figure of merit for the contour metric of each edge segment is satisfied. In one embodiment, the figure of merit is satisfied when the total error for the contour metric, e.g., CD or EPE, of each edge segment is minimized. In another embodiment, the figure of merit is satisfied when the total error for the contour metric of each edge segment is below a predetermined threshold. If the figure of merit is satisfied the process ends, but if the figure of merit is not satisfied, the process continues with step 320.

FIG. 5 shows two EPEs with opposite signs measured at two control points. If an assumed simulated resist image contour 414 does not overlap the feature's designed geometry 412 at the control point, then the EPE is determined based on the difference at that control point. Returning to FIG. 3, in step 320 the model-based OPC software calculates the edge correction amount at each control point. If it is assumed that the EPE of the i-th edge segment ($E_i$) is $\Delta E_i$ determined at control point $C_i$, the simplest edge correction amount $\Delta L_i$ is a negation of the error: $\Delta L_i = -\Delta E_i$. Such a straightforward correction function does not work well for non-linear processes because changes on the mask are not linearly reflected in the printed resist image. To account for nonlinearities such as the mask error factor (MEF), a slightly more complicated correction function can be used:

$$\Delta L_i = -\frac{\Delta E_i}{MEF}$$

In a real application, the method of calculating the appropriate correction is much more complex, and the correction algorithms can depend on factors such as linewidth error, fabrication process, correction goals, and constraints. See A. K. Wong, Resolution Enhancement Techniques in Optical Lithography, SPIE, Press, pp. 91-115, 2001. For example, if it is assumed that there are N edge segments of a feature and one control point for each edge segment, and that the correction amount for the i-th edge segment is $\Delta L_i$, the ultimate goal is to solve for $\Delta L_1, \Delta L_2, \ldots, \Delta L_N$, such that the difference between resist image values $RI(C_i)$ and the predetermined threshold values T at all control points are equal to zero as:

$RI=(C_i)-T=0$ for $i=1 \ldots N$, where $C_i$ are the control points.

Or minimize the function $$\sum_{i=1}^{N} [RI(C_i) - T]^2$$

Next, in step 322, the model-based OPC software adjusts the entire edge segment $E_i$ according to the calculated correction amount $\Delta L_i$ for all edge segments to produce a post-OPC layout, such that the simulated resist image contour moves to match the design geometry. Then the method returns to step 314, where the model-based OPC software simulates a resist image using the post-OPC layout produced in step 322. The resist image contours and error are then calculated for the simulated resist image produced using the post-OPC layout in step 316. In step 318 the model-based OPC software determines whether the total EP error is minimized or below a certain threshold. The total EP error may be defined as:

$$\text{Error}_{total} = \sum_{i=1}^{N} (\Delta E_i)^2$$

Alternatively, the total EP error can be defined as the maximum EP error of all segments, i.e., $$\max \{|\Delta E_i|\}, i=1, \ldots, N$$

since the OPC goal may be set such that all edge placement error must be below a certain threshold.

FIG. 6A shows a feature 610 and a corresponding simulated resist image 612 before processing by model-based OPC software, and FIG. 6B shows the feature 614 and a corresponding simulated resist image 616 after processing by model-based OPC software. The resist image 612 of FIG. 6A had large CD errors and corner rounding errors. In FIG. 6B, the edges of the original feature 610 have been biased segment-by-segment to produce the post-OPC feature 614. The post-OPC simulated resist image 616 has no CD error from the original design feature 610 and has significantly reduced corner rounding error.

While OPC corrections are commonly applied and optimized at nominal process condition only, it has been pointed out that current model-based OPC techniques cannot guarantee sufficiently-sized process windows for advanced device designs. See C. Spence, "Full-Chip Lithography Simulation and Design Analysis—How OPC is Changing IC Design," Proc. SPIE, Vol. 5751, pp. 1-14, 2005; S. H. Choi et al., "Illumination and Multi-Step OPC Optimization to Enhance Process Margin of the 65 nm Node Device Exposed by Dipole Illumination," Optical Microlithography XVIII, Bruce W. Smith, editor, Proc. SPIE, Vol. 5754, pg. 838-845 (2005). Some attempts have been made at improving process windows for specific features using rule-based modification, called "retargeting," to the pre-OPC layout. See K. Lucas et al., "Process, Design, and OPC Requirements for the 65 nm Device Generation," Proc. SPIE, Vol. 5040, pg. 408, 2003. One approach for rule-based retargeting of the pre-OPC layout includes selective biases and pattern shifts. This approach may improve the full process window performance for certain critical features, while still calculating OPC corrections only at nominal process condition, by selectively changing the target edge placements that the OPC software uses as the desired final result. Thus, instead of minimizing errors between the design dimensions and simulated edge placements, the OPC software instead minimizes errors between the retargeted dimensions and the simulated edge placements.

A user of the OPC software can retarget the design to improve the process window performance in a number of ways. In the simplest example of retargeting, rules can be applied to specific features to improve their printability and process window. For example, it is well known that isolated lines have poorer process window latitude than dense lines, but the process margin improves as the feature size increases. A simple rule could be applied to upsize small isolated lines, thereby improving the process window. Other rule-based retargeting methods have been developed where metrics other than CD are used to determine the retargeted edge placements, such as normalized image log slope (NILS) or sensitivity to mask CD errors (MEF or Mask Error Enhancement Factor (MEEF)).

Rule-based retargeting methods can improve printability of features across the process window, but they suffer from several disadvantages. These methods can become quite complex and are only based on the pre-OPC layout. Once the OPC corrections are added to a design, the printing performance as a function of process conditions can become quite different from what was anticipated from the pre-OPC design, introducing a significant error source and preventing the retargeting from achieving the desired results.

SUMMARY

One embodiment of a method for process window optimized optical proximity correction includes applying optical proximity corrections to a design layout using a model of the lithography process at nominal condition to produce a first post-OPC layout, simulating a lithography process using the first post-OPC layout and models of the lithography process at a plurality of process conditions to produce a plurality of simulated resist images. A weighted average error in the critical dimension or other contour metric for each edge segment of each feature in the design layout is determined, wherein the weighted average error is an offset between the contour metric at each process condition and the contour metric at nominal condition averaged over the plurality of process conditions. The weighted average error represents the average error across the process window of the lithography process. A retarget value for the contour metric for each edge segment of each feature is determined using the weighted average errors and is applied to the design layout prior to processing the design layout using optical proximity correction software and a model of the lithography process at nominal condition to produce a second post-OPC layout.

Another embodiment of a method for process window optimized optical proximity correction includes applying optical proximity corrections to a design layout using a model of a lithography process at nominal condition to produce a first post-OPC layout, simulating a lithography process using the post-OPC layout and a single model of the lithography process at a plurality of process conditions to produce a plurality of simulated resist images, where the single model of the lithography process has been calibrated over the entire process window of the lithography process. A weighted average error in the critical dimension or other contour metric for each edge segment of each feature in the design layout is determined, wherein the weighted average error is an offset between the contour metric at each process condition and the contour metric at nominal condition averaged over the plurality of process conditions. The weighted average error represents the average error across the process window of the lithography process. A retarget value for the contour metric for each edge segment of each feature is determined using the weighted average errors and is applied to the design layout prior to processing the design layout using optical proximity correction software and a model of the lithography process at nominal condition to produce a second post-OPC layout.

Another embodiment of a method for process window optimized optical proximity correction includes obtaining a design layout including features, dissecting the features into edge segments, assigning control points to each of the edge segments, simulating a lithography process using the design layout and a plurality of models of the lithography process (or a single model calibrated over the entire process window) at a plurality of process conditions to produce a plurality of simulated resist images, determining a simulated resist contour for each edge segment of each feature in each of the simulated resist images, determining an error in a contour metric at each control point of each edge segment in each of the simulated resist images, and determining if a figure of merit is satisfied. In one embodiment, the figure of merit is satisfied when the total error for the contour metric of each edge segment is minimized. In another embodiment, the figure of merit is satisfied when the total error for the contour metric of each edge segment is below a predetermined threshold. If the figure of merit is not satisfied, a weighted average error in the contour metric at each control point of each edge segment is determined, wherein the weighted average error is averaged over the plurality of simulated resist images. The weighted average error represents the average error across the process window of the lithography process. Then an edge correction amount at each control point of each edge segment is calculated corresponding to the weighted average error, and a position of each edge segment is adjusted according to the corresponding edge correction amount to produce a post-OPC layout.

Another embodiment of a method for process window optimized optical proximity correction includes obtaining a design layout including features, dissecting the features into edge segments, assigning control points to each of the edge segments, simulating a lithography process using the design layout and an average model of the lithography process at an average process condition to produce a simulated resist image, determining a simulated resist contour for each edge segment of each feature in the simulated resist image, and determining if a figure of merit is satisfied. In one embodiment, the figure of merit is satisfied when the total error for the contour metric of each edge segment is minimized. In another embodiment, the figure of merit is satisfied when the total error for the contour metric of each edge segment is below a predetermined threshold. If the figure of merit is not satisfied, an error in the contour metric at each control point of each edge segment is determined. Then an edge correction amount at each control point of each edge segment is calculated corresponding to the error in the contour metric, and a position of each edge segment is adjusted according to the corresponding edge correction amount to produce a post-OPC layout.

DETAILED DESCRIPTION OF THE INVENTION

Figure 7A:
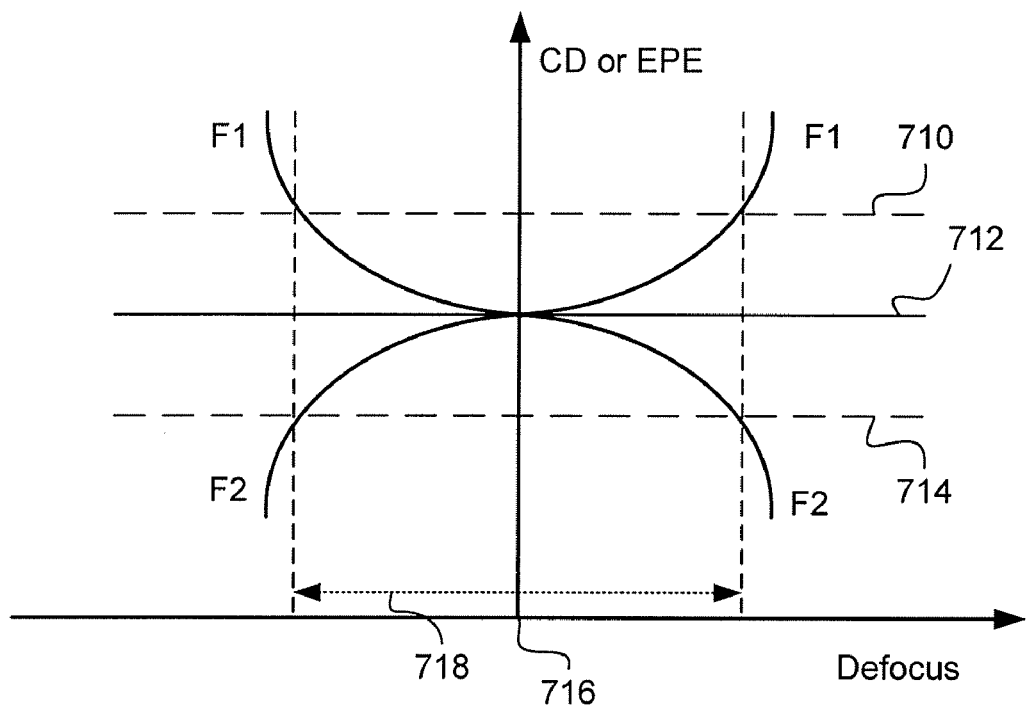
FIG. 7A is a diagram of CD or EP error versus defocus curves for two features.

FIG. 7A is a diagram of CD or EP error versus defocus curves for two features F1 and F2. At best focus 716 each curve's CD or EP error value is equal to a target value 712. Values 710 and 714 represent upper and lower specification limits for the error. The defocus values where the CD or EP error value is equal to the specification limits define a depth of focus 718. Since the error varies through focus, the distribution of printed CDs or EP errors around best focus 716 will generally not be centered in the allowable range (between specification values 710 and 714) even if the best focus CD or EP error perfectly matches target value 712. As shown in FIG. 7A, applying OPC corrections to optimize the CD or EP error only at nominal condition (here as best focus) results in a narrow depth of focus 718 and thus a small process window.

Figure 7B:
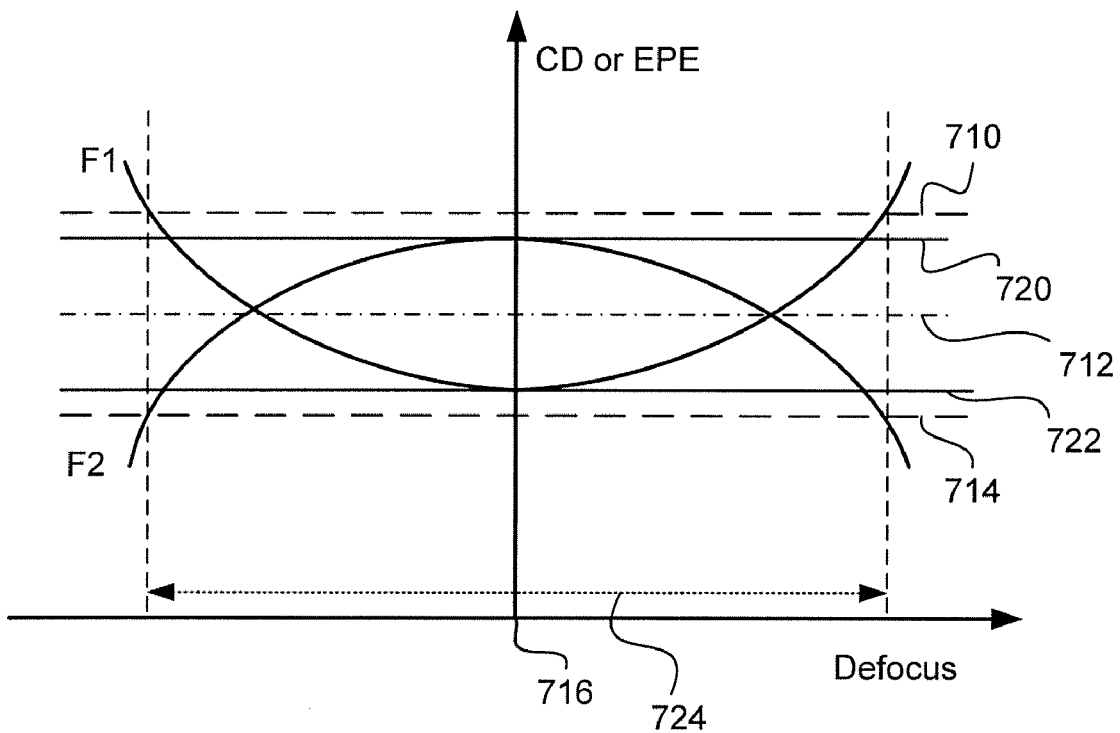
FIG. 7B is a diagram of retargeted CD or EP error versus defocus curves for two features.

FIG. 7B is a diagram of retargeted CD or EP error versus defocus curves for the two features F1 and F2. Both curves have been retargeted, meaning that OPC corrections have been applied to the features so that at best focus the CD or EP error matches new target values 720 and 722. The distributions of the retargeted curves are centered close to the original target value 712, which significantly increases the range over which CDs or EPEs are within the specification limits 710 and 714, increasing the depth of focus 724 and thus the process window.

Although the following disclosure discusses CD or EP error and focus, other measures of pattern fidelity, such as normalized image log slope (NILS) or sensitivity to mask CD errors (MEF or Mask Error Enhancement Factor (MEEF)) and other optical settings, e.g., exposure dose and lens aberrations, are within the scope of the invention.

Figure 8:
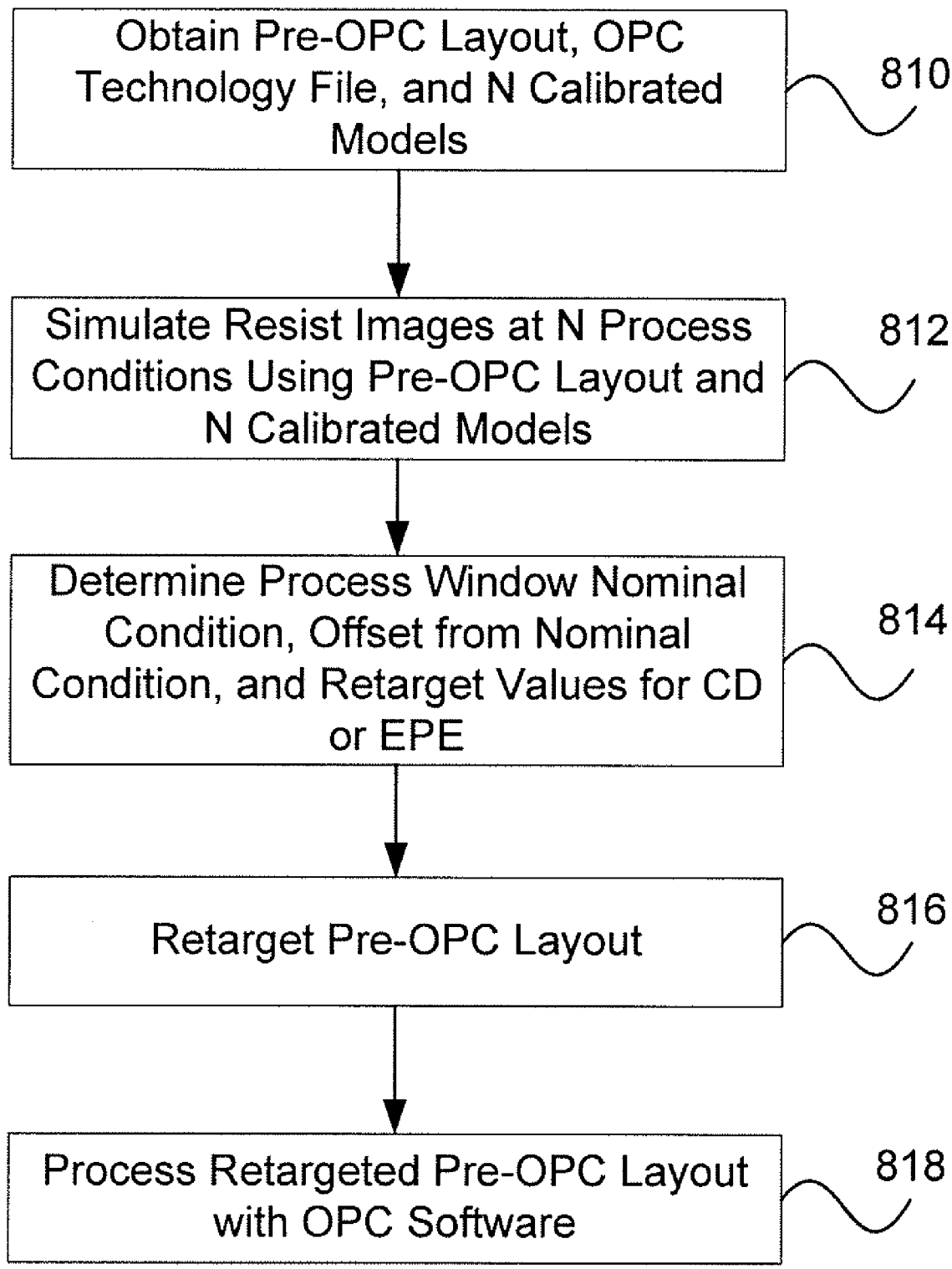
FIG. 8 is a flowchart of method steps for retargeting CD or EP errors using a pre-OPC layout, according to one embodiment of the invention.

FIG. 8 is a flowchart of method steps for retargeting CDs or EP errors using a pre-OPC layout, according to one embodiment of the invention. In step 810, a pre-OPC design layout, an OPC technology file, and N calibrated models are obtained. The pre-OPC design layout preferably has previously been modified using other resolution enhancement techniques such as phase-shifting or assist features. N is the sampling number of process conditions at which the printability of the features of the pre-OPC design are to be evaluated, so N calibrated models are required corresponding to the N sampling locations within a process window, where each model models the behavior of the optical and resist components of the lithography process. The N sampling locations cover the approximate extent of the required or desired depth of focus. In an alternative embodiment, a single FEM model that was calibrated over the entire process window can be used. The single FEM model is disclosed in U.S. patent application Ser. No. 11/461,994, entitled "System and Method for Creating a Focus Exposure Model of a Lithography Process," the subject matter of which is hereby incorporated by reference in its entirety. In step 812, the printed resist image is simulated at each of the N sampling process conditions using the pre-OPC layout and the corresponding calibrated models. One embodiment for simulating the printed resist images is disclosed in U.S. Pat. No. 7,114,145. The simulated resist images provide predicted printed CDs and EPEs for the pre-OPC layout.

In step 814, the simulated resist images are evaluated to determine the process window center (nominal condition) for each edge of each feature, offsets from the nominal condition for each edge, and the retarget values for CD or EPE for each edge. The retarget correction value for each edge is determined as the average offset between the predicted CDs at the N sampling process conditions and the CD at the nominal condition, or some other weighted average of those offsets. For example, a weighted average CD offset over the N process condition for each edge is determined by:

$$\Delta \overline{CD} = \frac{1}{N} \sum_{i=1}^{N} w_i (CD_i - CD_{nominal})$$

where $w_i$ are the weighting factors and the sum of all of the N weighting factors is 1, $CD_i$ are the predicted CDs at the N sampling process conditions, and $CD_{nominal}$ the CD value at the nominal condition.

The nominal condition, i.e., process window center, usually defined by the best focus value and the best exposure dose value for the exposure tool. The offsets of CD or EPE from the nominal condition are used to determine the retarget values, so that the retargeting cancels the offsets between the process window average and nominal condition.

In step 816, the pre-OPC layout is retargeted using the retarget values by adjusting the CDs or EP errors of each edge of each feature in the pre-OPC layout. Then in step 818 the retargeted pre-OPC layout is processed by OPC software using a single model at nominal condition to produce a post-OPC layout. The actual effect of the retargeting of the pre-OPC layout is not completely predictable due to the non-linear nature of the lithography process. Retargeting will not only shift a CD or EPE curve but will also change its shape. Thus, pre-OPC retargeting is not a precise quantitative correction, although it may indicate the correct direction and approximate magnitude of the changes to edge placements or CD biases. Also, since the pre-OPC layout is in most cases significantly less complex than the post-OPC layout, the process window analysis may be relatively quick. Retargeting the pre-OPC layout may reduce any major process window offsets inherent in the pre-OPC design layout.

Figure 1:
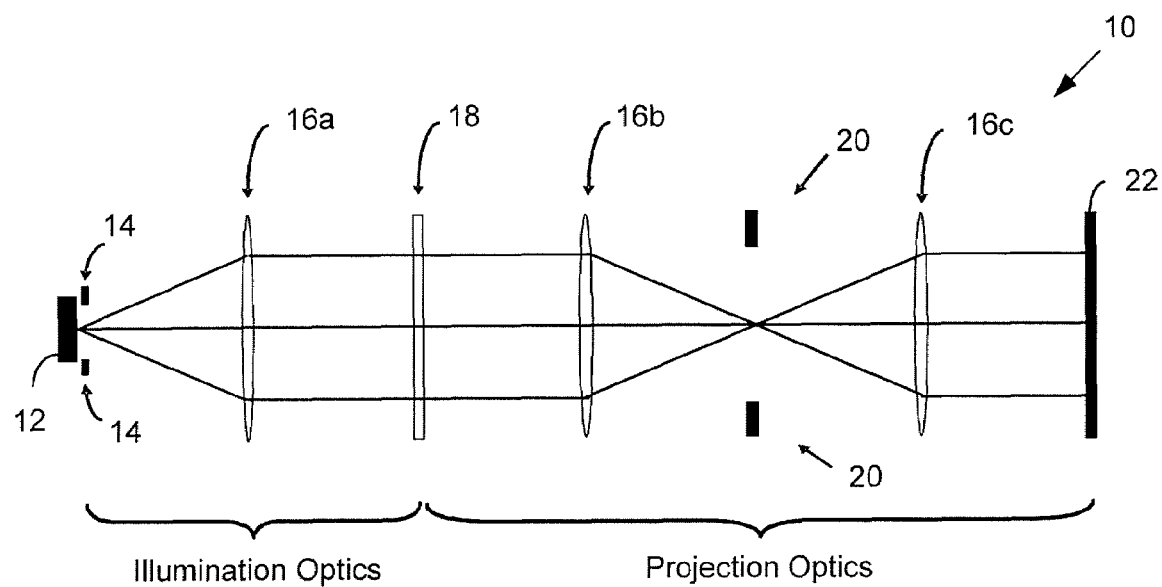
FIG. 1 is a diagram of one embodiment of a lithography system.
Figure 2A:
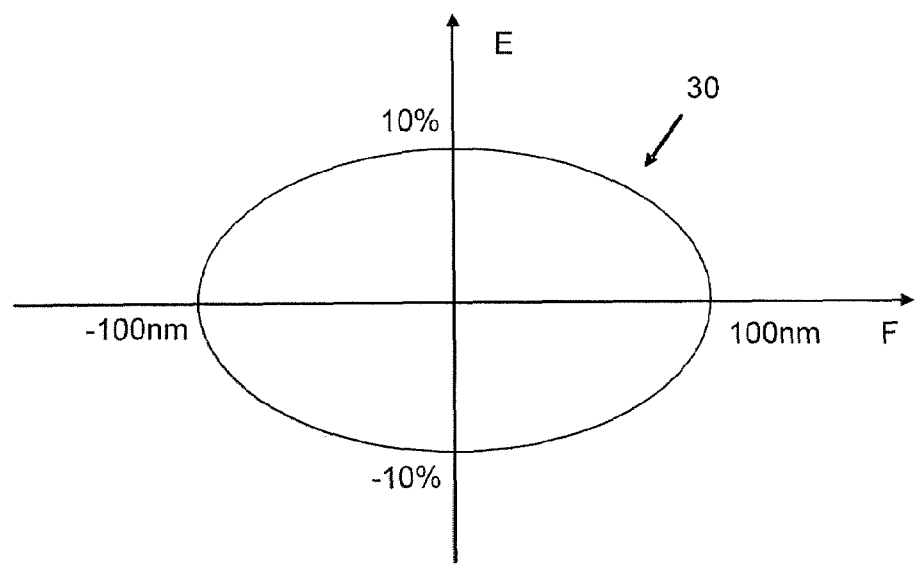
FIG. 2A is a diagram of one embodiment of a process window in a focus-exposure space.
Figure 2B:
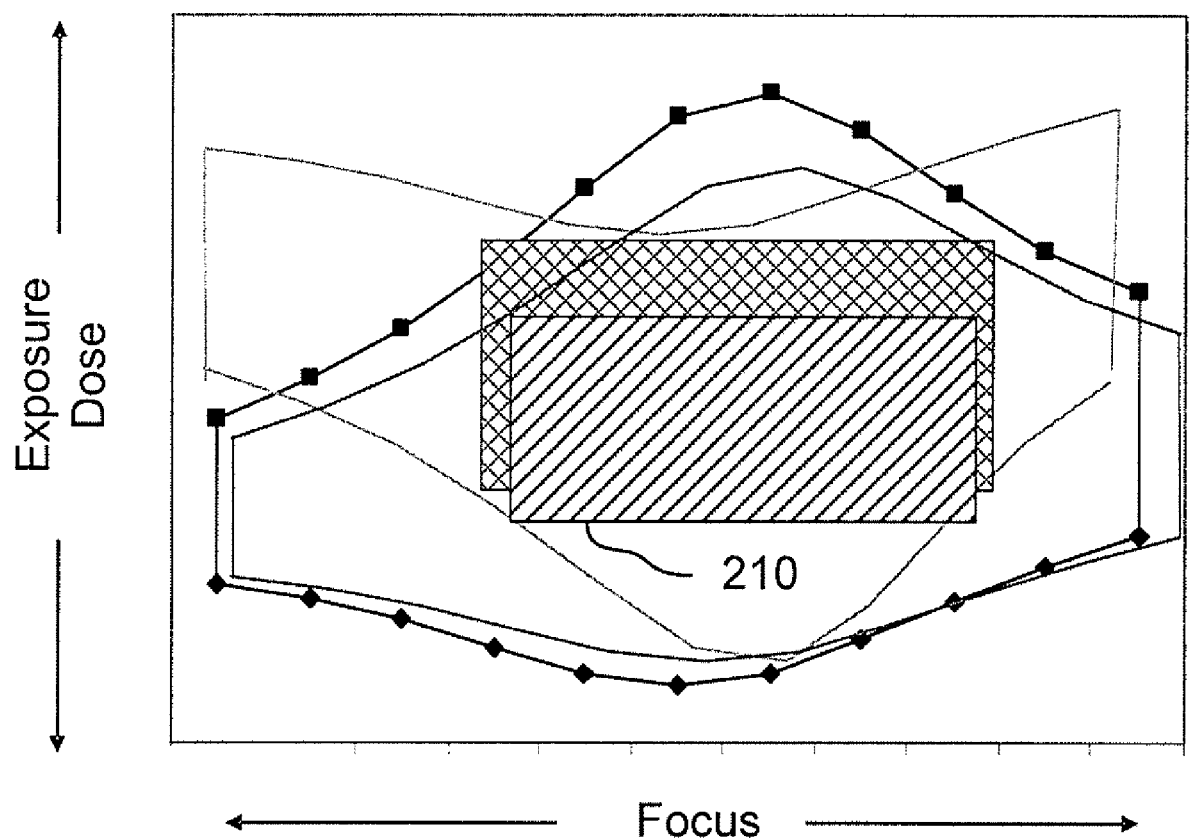
FIG. 2B is a diagram of several overlapping process windows in a focus-exposure space.
Figure 3:
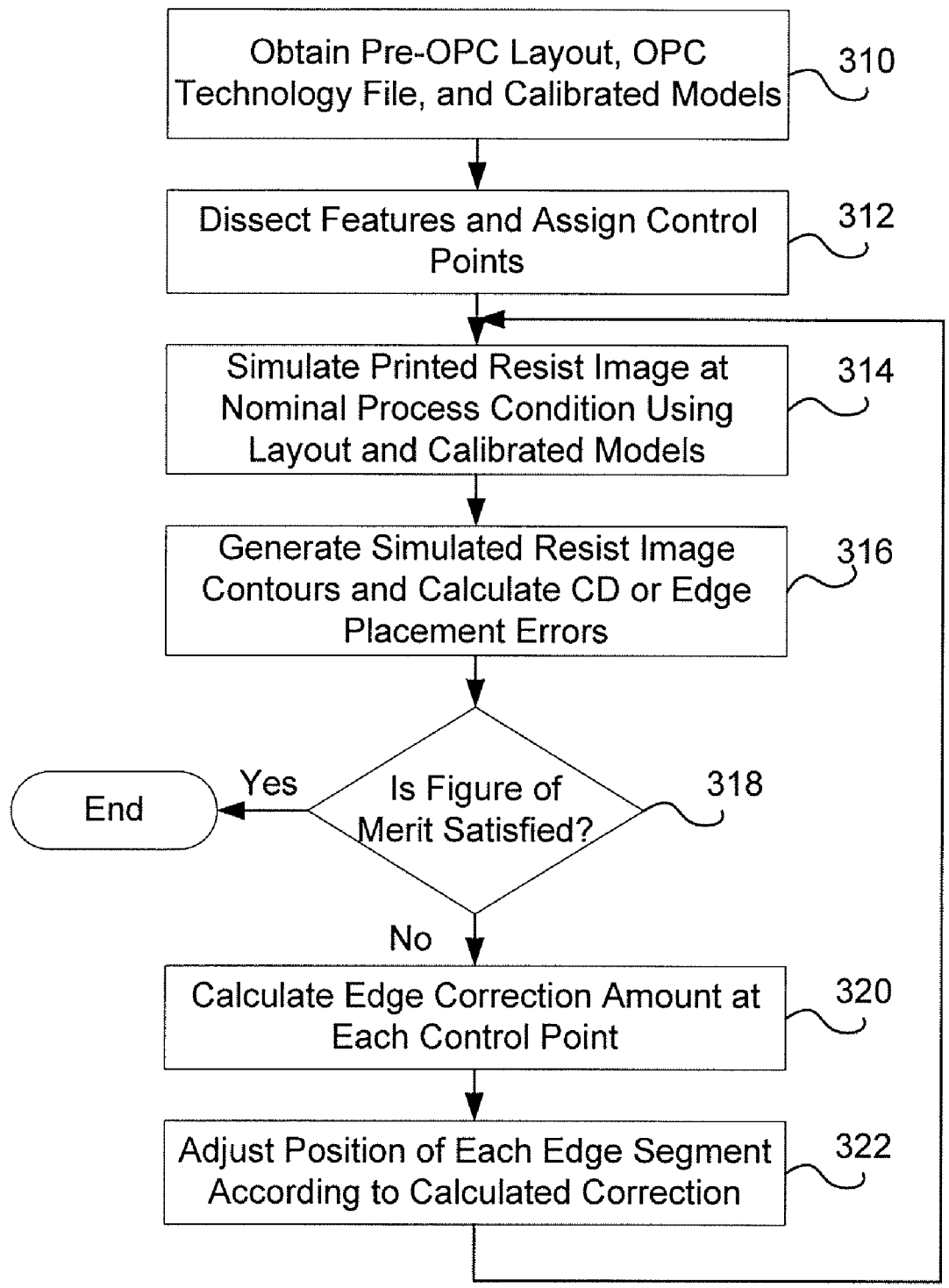
FIG. 3 is a flowchart of method steps for model-based OPC.
Figure 4:
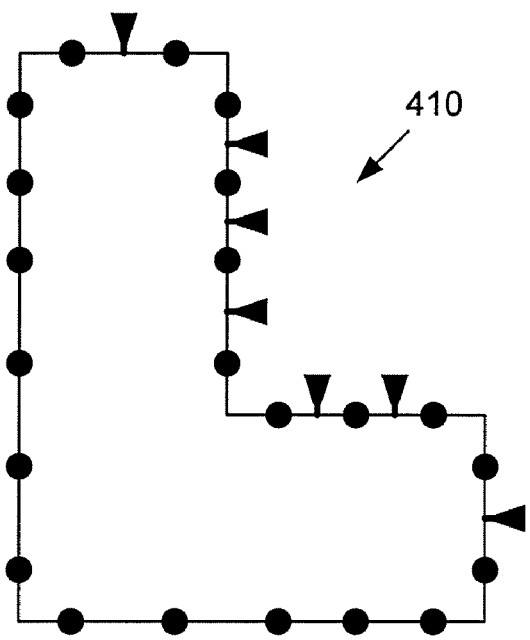
FIG. 4 is a diagram of a feature including edge segments and control points.
Figure 5:
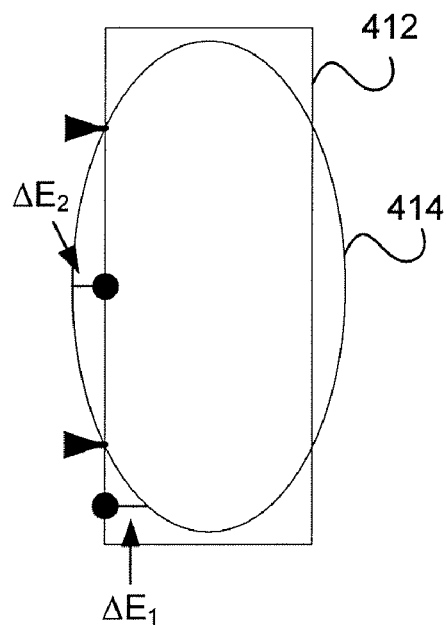
FIG. 5 is a diagram of a feature and an assumed simulated resist image showing edge placement errors.
Figure 6A:
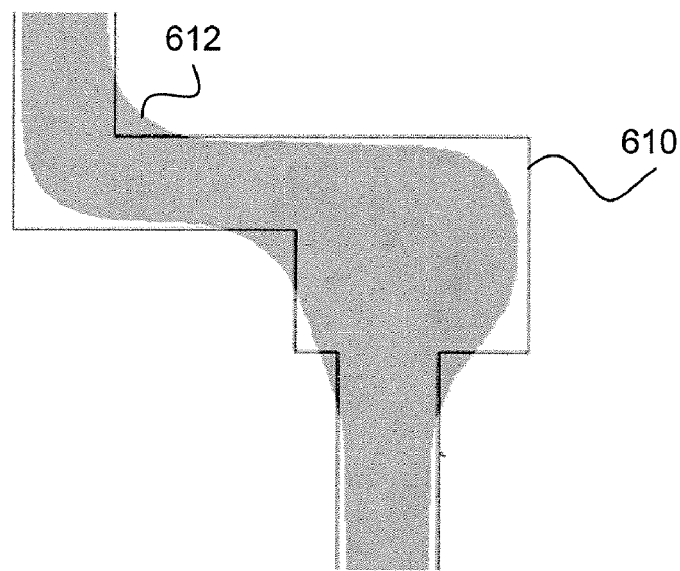
FIG. 6A is a diagram of a feature and a simulated resist image prior to application of OPC.
Figure 6B:
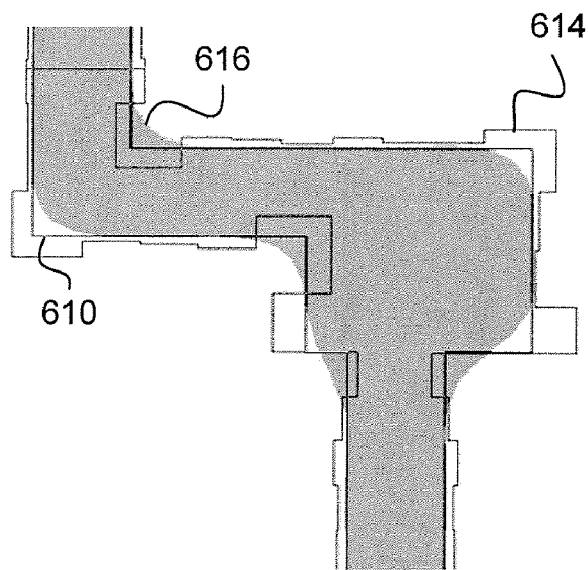
FIG. 6B is a diagram of a feature and a simulated resist image after the application of OPC.
Figure 9:
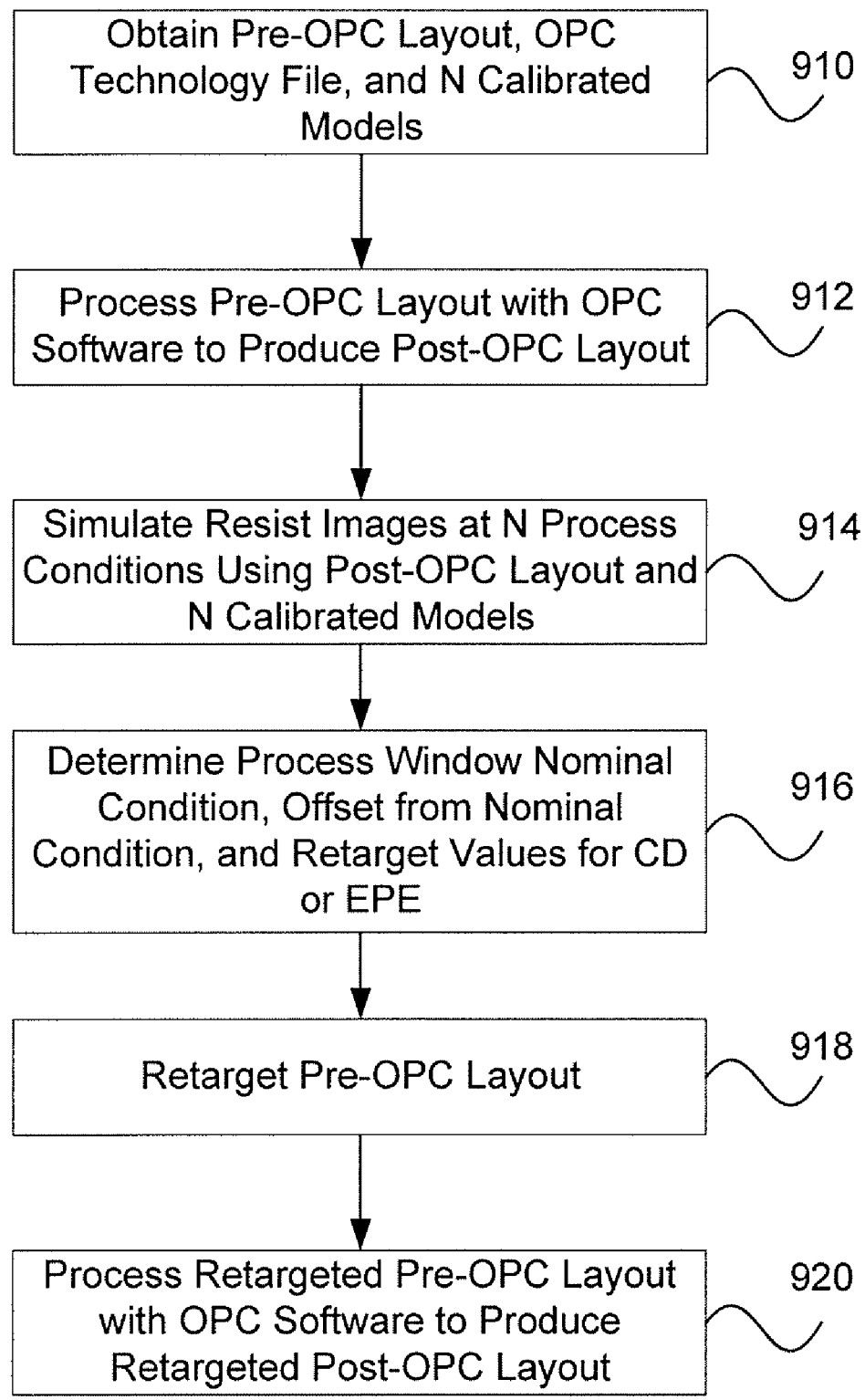
FIG. 9 is a flowchart of method steps for retargeting CD or EP errors using a post-OPC layout, according to one embodiment of the invention.

FIG. 9 is a flowchart of method steps for retargeting CDs or EP errors using a post-OPC layout, according to one embodiment of the invention. In step 910, a pre-OPC design layout, an OPC technology file, and N calibrated models are obtained. The pre-OPC design layout preferably has previously been modified using other resolution enhancement techniques such as phase-shifting or assist features. N is the sampling number of process conditions at which the printability of the features of the post-OPC design are to be evaluated, so N calibrated models are required corresponding to the N sampling locations within a process window. The N sampling locations cover the approximate extent of the required or desired depth of focus. In an alternative embodiment, a single FEM model that was calibrated over the entire process window, as disclosed in U.S. patent application Ser. No. 11/461,994, can be used. In step 912, the pre-OPC layout is processed by OPC software using a single model at nominal condition to produce a post-OPC layout, for example as described above in conjunction with FIG. 3. In step 914, the printed resist images are simulated at each of the N sampling process conditions using the post-OPC layout and the corresponding calibrated model. The simulated resist images provide predicted printed CDs and EPEs for the post-OPC layout at the N sampling process conditions.

In step 916, the simulated resist images are evaluated to determine the process window center (nominal condition) for each edge segment of each feature, offsets from the nominal condition for each edge segment, and the retarget values for CD or EPE for each edge segment. The retarget correction value for each edge segment is determined as the average offset between the predicted CDs at the N sampling process conditions and the CD at the nominal condition, or some other weighted average of those offsets. The nominal condition is defined by the best focus value and the best exposure dose value for the exposure tool. The offsets of CD or EPE from the nominal condition are used to determine the retarget values, so that the retargeting cancels the offsets between the process window average and nominal condition. Determining the retargeting values may include performing a numerical analysis of a local mask error factor or of a normalized image log slope.

In step 918, the pre-OPC layout is retargeted using the retarget values by adjusting the CDs or EPs of each edge segment of each feature in the pre-OPC layout. In step 920 the retargeted pre-OPC layout is processed with OPC software using a single model at nominal condition to produce a retargeted post-OPC layout. With this retargeting process, while the retargeted post-OPC layout will produce a resist contour that matches with the retargeted pre-OPC layout under nominal condition, the retargeted post-OPC layout will produce a resist contour that matches with the original pre-OPC layout under the weighted average of the N sampling process conditions. Thus, the retargeted post-OPC layout has a larger process window to achieve the original goal defined by the original pre-OPC layout. It can generally be expected that retarget values derived from post-OPC simulation data will enable a retargeted layout to provide better performance than retarget values derived from pre-OPC simulation data because the various effects of all OPC corrections are taken into account in determining the post-OPC retarget values. However, two iterations of the OPC processing are required, which requires multiple iterations of lithography simulations (see FIG. 3) and thus is more time consuming. In one embodiment, step 920 will be followed by a repeated process window analysis step to determine the improvement gained by retargeting the pre-OPC layout. If the improvement is not sufficient, another set of retarget values may be determined and then applied to the pre-OPC layout.

Figure 10A:
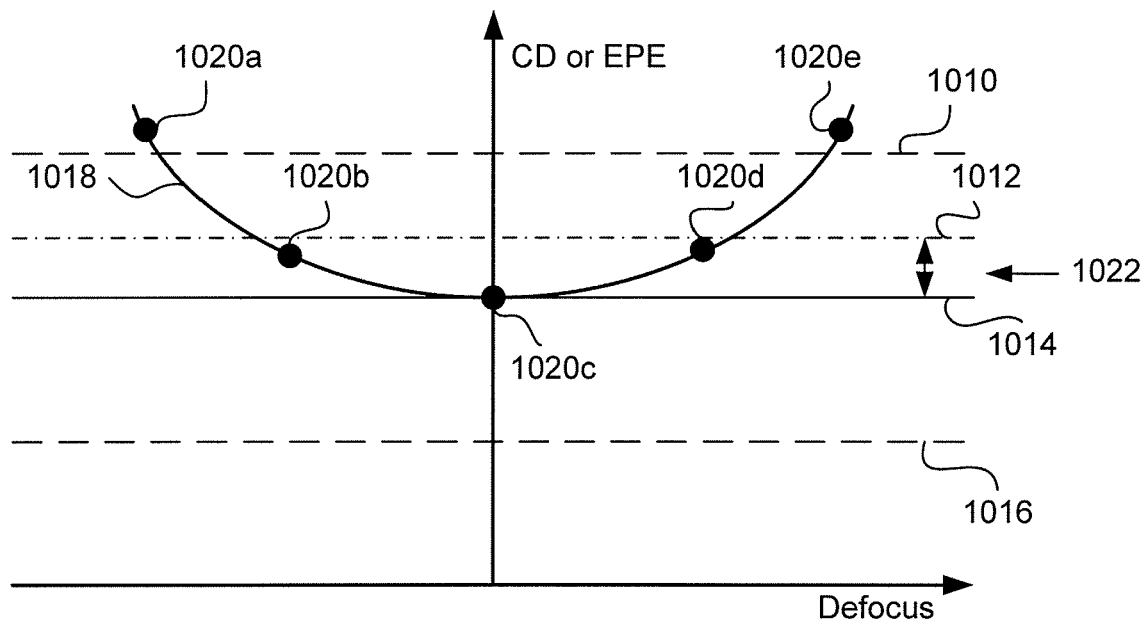
FIG. 10A is a diagram of a CD or EP error versus defocus curve for a feature and an average error value, according to one embodiment of the invention.

FIG. 10A is a diagram of a simulated CD or EP error versus defocus curve 1018 for a feature with specification values 1010 and 1016. The CD or EP error values 1020a-1020e at five different focus values (i.e., five different process conditions) were determined from the simulated resist images at those five focus values. A value 1012 is the weighted average of CD or EP error values 1020a-1020e. The weighted average CD or EP error 1012 differs from an original target value 1014 by an offset 1022. A suitable weighting of the CD or EP error values 1020a-1020e can be found to produce an average that will automatically center the CD or EPE distribution within the specification limits 1010 and 1016, and thereby maximize the process window.

Figure 10B:
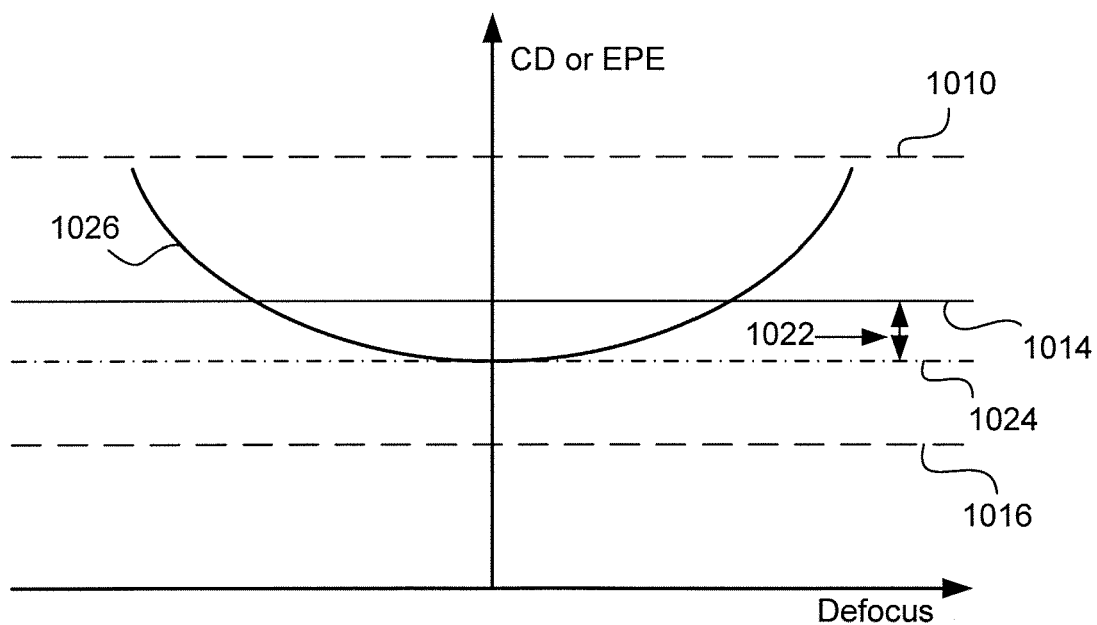
FIG. 10B is a diagram of CD or EP error versus defocus curves for a feature retargeted using an average error value; according to one embodiment of the invention.

FIG. 10B is a diagram of a CD or EPE versus defocus curve 1026 for a retargeted feature. A retarget value 1024 differs from the original target value 1014 by the offset value 1022. Applying the offset value 1022 to the original target value in the opposite direction shifts the curve such that the weighted average of curve 1026 over the process window is at or near the original target value 1014. After applying the optimized retargeting, the total CD error or EP error over the process window is minimized while the CD value at best focus is offset from the original target CD or EPE value. That is, while sacrificing an exact match to the original target value at best focus (nominal condition), the method of FIG. 9 minimizes the following total error over multiple process conditions:

$$\text{Error} = \sum_{i=1}^{N} (CD_i^* - CD_{target})^2$$

where $CD_i^*$ is the CD at the i-th process condition after retargeting.

Figure 11:
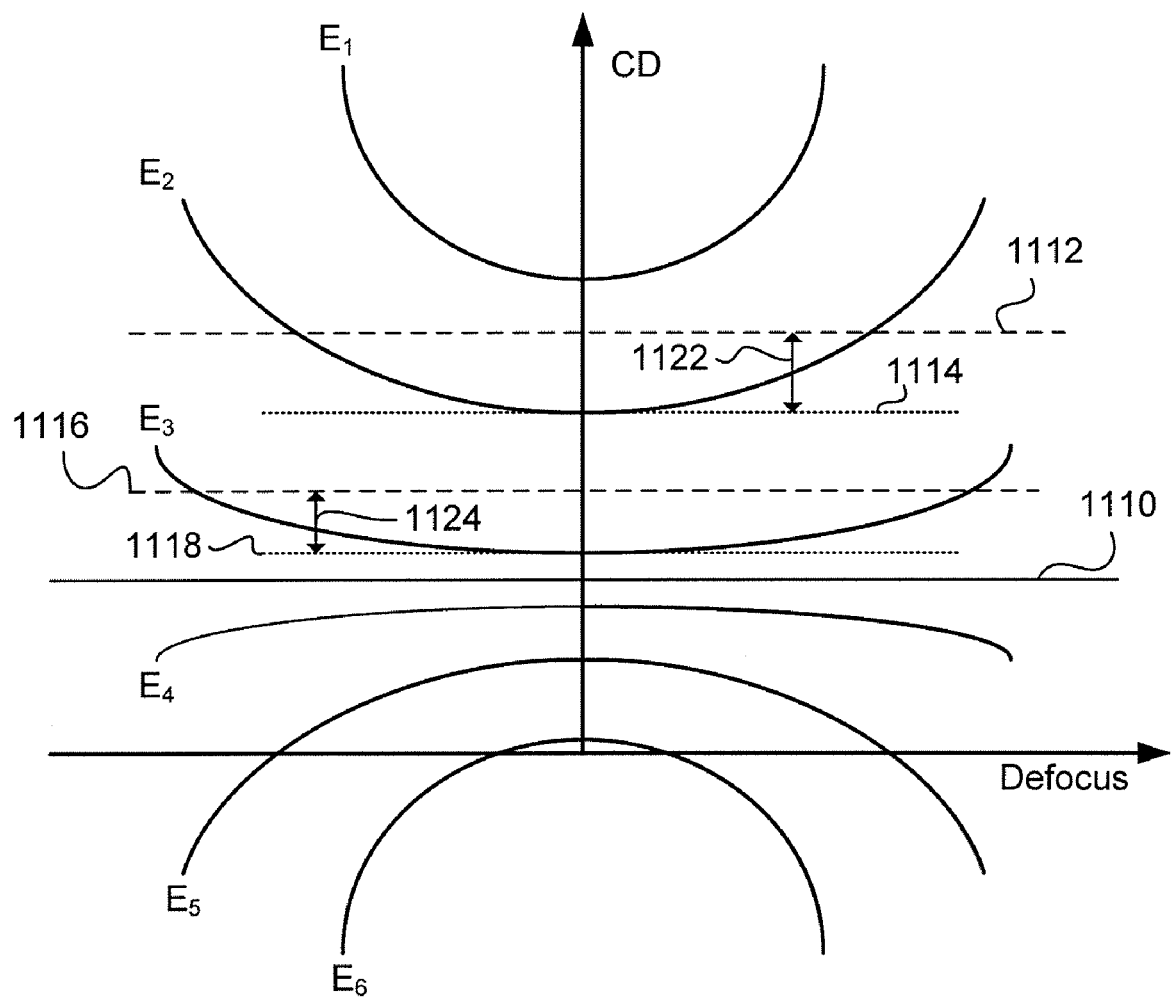
FIG. 11 is a diagram of CD versus focus curves for a feature at various exposure values, according to one embodiment of the invention.

FIG. 11 is a diagram of CD versus focus curves for a feature at various exposure values $E_i$, according to one embodiment of the invention. In the case of CD variations at low absolute values close to the resolution limit of the exposure tool, variations in feature size, e.g., line widths or contact diameter, correspond predominantly to variation in total exposure energy of the particular feature. For such features, the tuning of target feature size has a similar effect as tuning the exposure dose, i.e., effectively changes the CD or EPE vs. focus curve's flatness. The curves shown in FIG. 11 illustrate two general aspects of retargeting using the weighted average process conditions. First, a shift in the target CD value 1110 towards the desired direction to optimize the process window is normally accompanied by a flattening of the curve, just like when exposure dose is locally varied towards an isofocal value. The isofocal value minimizes the variation of CD through focus. The effect of flattening the CD curve as a result of retargeting by changing the local exposure dose can ideally amplify the improvements in depth of focus expected from a linear shift of the CD curve. Second, CD curves with larger curvature are typically farther from the isofocal value and should therefore have a larger retargeting shift applied. For example, an offset value 1122 between the weighted average CD value 1112 and nominal condition 1114 for the CD curve at $E_2$ is greater than an offset value 1124 between the weighted average CD value 1116 and nominal condition 1118 for the CD curve at B3. A larger shift for structures with larger overall CD variation is automatically built into the retargeting by weighted average of process conditions for model-based OPC.

Figure 12:
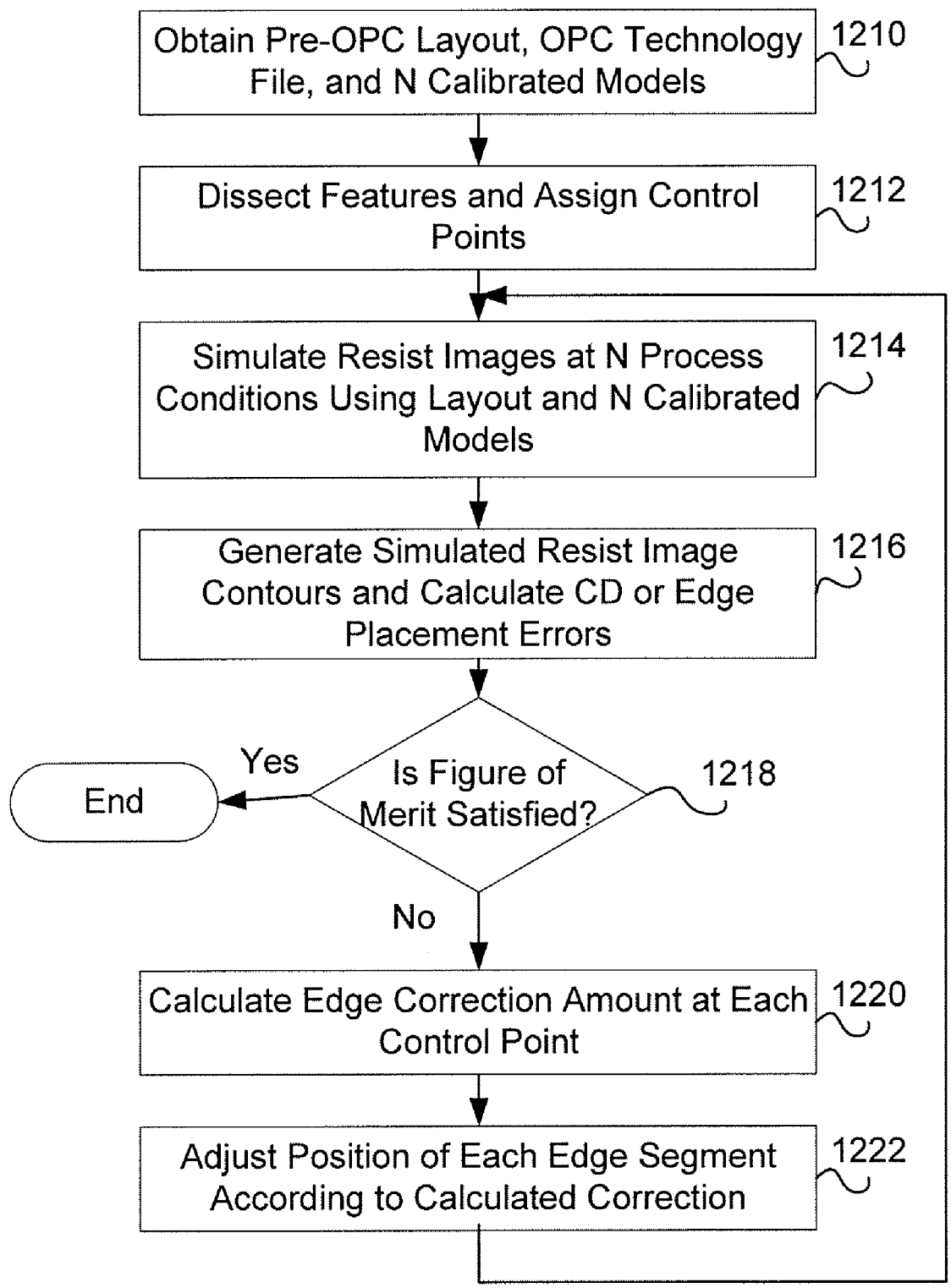
FIG. 12 is a flowchart of method steps for model-based OPC using a plurality of calibrated models of a lithography process, according to one embodiment of the invention.

FIG. 12 is a flowchart of method steps for model-based OPC using a plurality of calibrated models of a lithography process, according to one embodiment of the invention. Unlike the prior art method of FIG. 3, where the simulation is performed only at the nominal process condition, in the method of FIG. 12 the model-based OPC software simulates a lithography process using the design layout and a plurality of calibrated models of the lithography process at a plurality of process conditions to produce a plurality of simulated resist images. In step 1210, a pre-OPC design layout, an OPC technology file, and N calibrated models are obtained. N is the sampling number of process conditions at which the printability of the features of the pre-OPC design are to be evaluated, so N calibrated models are required corresponding to the N sampling locations within a process window, where each model models the behavior of the optical and resist components of the lithography process. In an alternative embodiment, a single FEM model that was calibrated over the entire process window can be used. The single FEM model is disclosed in U.S. patent application Ser. No. 11/461,994, entitled "System and Method for Creating a Focus Exposure Model of a Lithography Process," the subject matter of which is hereby incorporated by reference in its entirety. In a preferred embodiment, the plurality of process conditions includes three unique process conditions including best focus and best exposure dose and two "worst" process conditions that are usually the corner points of a process window.

In step 1212, the model-based OPC software dissects the features in the pre-OPC layout into edge segments and assigns control points to each edge segment. In step 1214, the model-based OPC software simulates the printed resist images at each of the N process conditions using the pre-OPC layout and the corresponding calibrated model. In step 1216, the model-based OPC software uses the simulated resist images to determine the predicted printed CD errors or EP errors at each control point of each edge segment for the pre-OPC layout. For example, assuming an edge placement error for an edge segment is ΔE determined at its control point, a weighted average EP error over the N process conditions at each control point of each edge segment is determined by $$\overline{\Delta EPE} = \frac{1}{N}\sum_{i=1}^{N} w_i(\Delta E_i)$$

where $w_i$ are the weighting factors and the sum of all of the N weighting factors equals 1, and $\Delta E_i$ are the predicted EP errors corresponding to the N sampling process conditions.

In step 1218, if a figure of merit for the contour metric of each edge segment over the plurality of resist images is satisfied, then the method ends. In one embodiment, the figure of merit is satisfied when the total error for the contour metric, e.g., EPE, of each edge segment is minimized. In another embodiment, the figure of merit is satisfied when the total error for the contour metric of each edge segment is below a predetermined threshold. If the figure of merit is not satisfied, then in step 1220 the model-based OPC software calculates the edge correction amount at each control point according to the N number of CD errors or EP errors. The edge correction amount can be a negation of the weighted average EP error or the maximum EP error determined at each control point of each edge segment. The edge correction amount is then adjusted according to the mask error factor (MEF).

Next, in step 1222, the model-based OPC software adjusts the position of the entire edge segment according to the calculated correction amount for all edge segments to produce a post-OPC layout, such that the simulated resist image contour moves to match the design geometry. Then the method returns to step 1214, where the model-based OPC software simulates a resist image using the post-OPC layout produced in step 1222. The resist image contours and errors of the contour metric are then calculated for the simulated resist image produced using the post-OPC layout in step 1216. In step 1218 the model-based OPC software determines whether the total EP error is minimized or below a predetermined threshold value. After applying the optimized edge correction, the total CD error or EP error for each edge segment over the process window is minimized or below a threshold value while the CD value at best focus is offset from the original target CD. That is, while sacrificing an exact match to the target value at the nominal condition, the method of FIG. 12 minimizes the following total error over multiple process conditions:

$$\text{Error} = \sum_{i=1}^{N} (CD_i^* - CD_{target})^2$$

where $CD_i^*$ is the CD at the i-th process condition.

Another embodiment for model-based OPC according to the invention is to use an average model to produce simulated resist images. Unlike the method of FIG. 12 where the edge correction is determined by averaging CD errors or EP errors at each control point of each edge segment from a plurality of simulated resist images using a plurality of calibrated models at a plurality of process conditions, an average model can be generated by averaging a plurality of calibrated models of the lithography process over the process window. The averaging may be weighted to emphasize particular areas of the process window. The process window information is incorporated into the simulation, providing automatic improvements in process window centering for all features.

In one embodiment, a method of generating an average model for simulating resist images is based on a separable model of the lithography process. A separable model includes individual components that correspond to physically separate entities of the lithography process, and a correctly calibrated separable model will only require adjustments in the model components when physical changes are made to the corresponding physical components of the lithography process. A separable model will typically include an optical model component and a resist model component, and may optionally include a mask model. One embodiment of a separable model and a method of calibrating the model over the entire process window is disclosed in U.S. patent application Ser. No. 11/461,994. The behavior of the lithography process through-focus (or other process window variables) can be modeled by changes to the optical model component only, without requiring any adjustments to the resist or mask model components.

For a model that describes the optical component by a set of transmission cross coefficients (TCC) with which the design layout image is convolved to produce a simulated aerial image (see U.S. Pat. No. 7,114,145), developing an average model can be achieved by averaging the TCCs of the different process window conditions. The average TCC may then be applied to the design layout image to simulate an average aerial image that provides information on the process window behavior with only one simulation.

In the following equation, the average image intensity I (assuming a one-dimensional case) is given by an average over multiple (N) optical settings having an index m. The expression in curly brackets on the first line describes the individual images at each setting m by a convolution of the mask M (i.e., the design layout image) with a source function A (describing the illumination profile) and the pupil function P (describing the projection optics). This is transformed in lines 2 and 3 to a sum over TCCs, which are implicitly defined by the sum in square brackets on line 3. In lines 4 and 5, the "sum then average" of process conditions is moved into the TCC computation, resulting in an average TCC that can be used to describe the process condition average model. In this equation, a simple average is used. In another embodiment, a weighted average is used to emphasize certain areas of the process window.

calibrated separable model. In addition, an empirical resist model may apply only linear operations to an aerial image input (before resist contours are determined by thresholding) such as convolution with one or more Gaussian functions to simulate the effects of acid diffusion during post exposure bake and etching effects. For example, a "resist image" R may be derived from an aerial image A as:

$$R = c_0 A + c_1 A \otimes G_1 + c_2 A \otimes G_2 + M$$

where $G_1$ and $G_2$ are Gaussian functions, $c_i$ are constants, and M may be a slowly varying function depending on overall pattern density. Resist contours will then be derived from R by applying a constant threshold T, e.g., by finding contour lines such that R−T=0.

For this resist model, an average resist image is exactly given by $$\tfrac{1}{2}(R_1 + R_2) = \tfrac{1}{2}[c_0(A_1 + A_2) + c_1(A_1 + A_2) \otimes G_1 + c_2(A_1 + A_2) \otimes G_2] + M$$

i.e., the same linear operation being applied to the simulated average aerial image as to an aerial image at a single nominal condition, without any change in parameters. While this averaging will be exact for a "linear" resist model, a sufficiently accurate approximation may also be achieved with a more general resist model. Even in the case of a non-separable model of the lithography process, where resist parameter changes could be required to accurately predict resist contours under changes in optical conditions, the resist model itself could be suitably averaged in a calibration procedure across the process window.

$$\langle I(x) \rangle = \frac{1}{N} \sum_m \left\{ \sum_k \left| A_k \sum_{k'} M(k'-k) P_m(k') \exp(-jk'x) \right|^2 \right\}$$

$$= \frac{1}{N} \sum_m \left\{ \sum_k A_k^2 \left[ \sum_{k'} \sum_{k''} M(k'-k) P_m(k') M^*(k''-k) P_m^*(k'') \exp(-j(k'-k'')x) \right] \right\}$$

$$= \frac{1}{N} \sum_m \left\{ \sum_{k'} \sum_{k''} \left[ \sum_k A_k^2 P_m(k+k') P_m^*(k+k'') \right] M(k') M^*(k'') \exp(-j(k'-k'')x) \right\}$$

$$= \sum_{k'} \sum_{k''} \left\{ \frac{1}{N} \sum_m \sum_k A_k^2 P_m(k+k') P_m^*(k+k'') \right\} M(k') M^*(k'') \exp(-j(k'-k'')x)$$

$$= \sum_{k'} \sum_{k''} \langle TCC_{k'k''} \rangle M(k') M^*(k'') \exp(-j(k'-k'')x)$$

A benefit of this approach is that the TCCs describe the optical system independent of the mask pattern. TCCs can be computed before having any knowledge of the mask layout and can subsequently be applied to any mask pattern. The averaging over optical settings $P_m$ can be pulled into the calculation of the TCCs to result in average TCCs, denoted here by <TCC>, that can be applied exactly the same way as using TCCs at a single optical setting.

Figure 13:
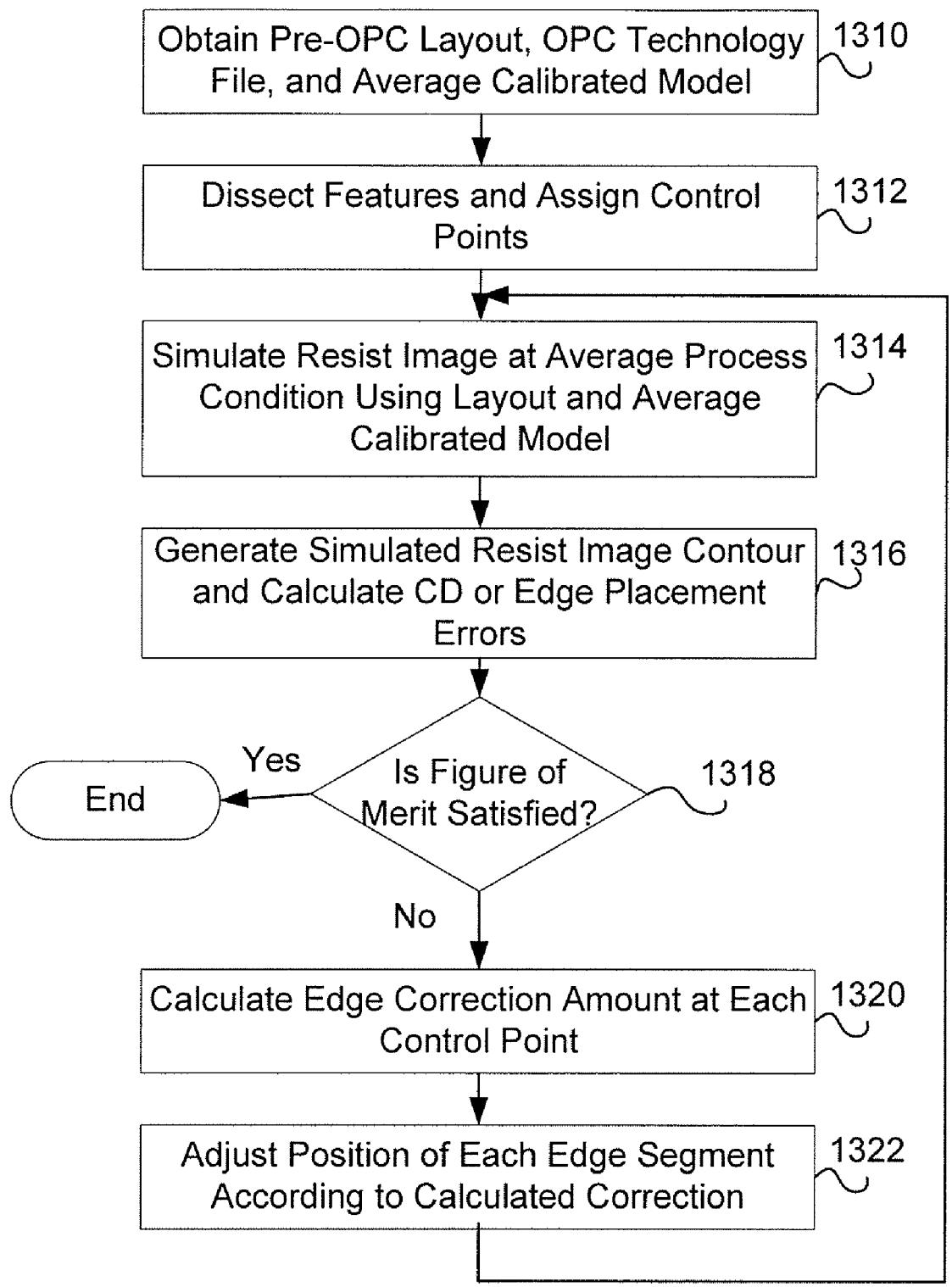
FIG. 13 is a flowchart of method steps for model-based OPC using an average calibrated model of a lithography process, according to one embodiment of the invention.

It should be noted that the range of image changes across a process window is generally small, typically corresponding to a variation in CD by a few percent of the target value, i.e., not more than a few nanometers. Changes in resist patterns as a result of small image changes can be expected to be linear over a limited range of variation. In this case, the resist model applied to the simulated average aerial image will exactly predict the average edge placement and CDs resulting from the optical parameter changes. This is particularly true for a FIG. 13 is a flowchart of method steps for model-based OPC using an average model of a lithography process, according to one embodiment of the invention. Unlike the method of FIG. 12, where the edge correction is determined by averaging CD errors or EP errors at each control point of each edge segment from a plurality of simulated resist images using a plurality of calibrated models at a plurality of process conditions, the method of FIG. 13 uses an average model generated by averaging a plurality of calibrated models of the lithography process over the process window before performing a lithography simulation. The method of FIG. 13, therefore, is almost identical to the prior art method of FIG. 3, except that in step 1314 the resist image is simulated using an average model. The single average model replaces the model used at the nominal process condition (and corresponding simulation iterations) of FIG. 3 to simulate a lithography process using the design layout at an average process condition to produce a simulated resist image. Only one error in the edge placement or other contour metric at each control point for each edge segment in the design layout is determined from the simulated resist image. Then an edge correction amount at each control point of each edge segment is calculated corresponding to the edge placement error, and a position of each edge segment is adjusted according to the corresponding edge correction amount to produce a post-OPC layout. There are other embodiments that can use the average model described above. For example, an average model can be used for retargeting CD or EP errors using a pre-OPC layout in as described in the method of FIG. 8, or can be used for retargeting CD or EP errors using a post-OPC layout as described in the method of FIG. 9 by replacing the plurality of calibrated models of a lithography process with the single average model in the lithography process simulation.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A method comprising:
   obtaining a design layout including features, each feature including edge segments;
   applying optical proximity corrections to the design layout to produce a first post-OPC layout;
   simulating, using a computer executing model-based OPC software, a lithography process using the first post-OPC layout and a plurality of models of the lithography process at a plurality of process conditions to produce a plurality of simulated resist images;
   determining a simulated resist contour for each edge segment of each feature of the design layout in each of the plurality of simulated resist images;
   determining a weighted average error in a contour metric for each edge segment over the plurality of process conditions, wherein the error in the contour metric is an offset between the contour metric at each of the plurality of process conditions and the contour metric at nominal condition;
   determining a retarget value for the contour metric for each edge segment using the weighted average error;
   applying each retarget value to the corresponding edge to produce a retargeted layout; and
   applying optical proximity corrections to the retargeted layout to produce a second post-OPC layout.

2. The method of claim 1, wherein the contour metric is critical dimension.

3. The method of claim 1, wherein the contour metric is edge placement error.

4. The method of claim 1, wherein each of the plurality of models includes an optical model component and a resist model component.

5. The method of claim 1, wherein the plurality of process conditions comprises three process conditions including best focus and best exposure dose and two process conditions at corner points of a process window.

6. The method of claim 1, wherein the plurality of process conditions includes one or more of focus, exposure dose, film thickness, reflectivity, numerical aperture, illumination, lens aberrations, resist bake temperature, resist development time, and etch time.

7. The method of claim 1, wherein determining a retarget value includes performing a numerical analysis of a local mask error factor.

8. The method of claim 1, wherein determining a retarget value includes performing a numerical analysis of a normalized image log slope.

9. A method comprising:
   obtaining a design layout including features, each feature including edge segments;
   applying optical proximity corrections to the design layout to produce a first post-OPC layout;
   simulating using a computer executing model-based OPC software a lithography process using the first post-OPC layout and a model of the lithography process at a plurality of process conditions to produce a plurality of simulated resist images, wherein the model of the lithography process was calibrated over all of the plurality of process conditions;
   determining a simulated resist contour for each edge segment of each feature of the design layout in each of the plurality of simulated resist images;
   determining a weighted average error in a contour metric for each edge segment over the plurality of process conditions, wherein the error in the contour metric is an offset between the contour metric at each of the plurality of process conditions and the contour metric at nominal condition;
   determining a retarget value for the contour metric for each edge segment using the weighted average error;
   applying each retarget value to the corresponding edge segment to produce a retargeted layout; and
   applying optical proximity corrections to the retargeted layout to produce a second post-OPC layout.

10. The method of claim 9, wherein the contour metric is critical dimension.

11. The method of claim 9, wherein the contour metric is edge placement error.

12. The method of claim 9, wherein the model of the lithography process includes an optical model component and a resist model component.

13. The method of claim 10, wherein the plurality of process conditions comprises three process conditions including best focus and best exposure dose and two process conditions at corner points of a process window.

14. The method of claim 9, wherein the plurality of process conditions includes one or more of focus, exposure dose, film thickness, reflectivity, numerical aperture, illumination, lens aberrations, resist bake temperature, resist development time, and etch time.

15. The method of claim 9, wherein determining a retarget value includes performing a numerical analysis of a local mask error factor.

16. The method of claim 9, wherein determining a retarget value includes performing a numerical analysis of a normalized image log slope.

* * * * *